United States Patent
Kise et al.

(10) Patent No.: US 9,236,706 B2
(45) Date of Patent: Jan. 12, 2016

(54) SURFACE-EMITTING LASER APPARATUS, OPTICAL MODULE, AND METHOD OF DRIVING SURFACE-EMITTING LASER ELEMENT

(71) Applicant: FURUKAWA ELECTRIC CO., LTD., Tokyo (JP)

(72) Inventors: Tomofumi Kise, Tokyo (JP); Suguru Imai, Tokyo (JP); Masaki Funabashi, Tokyo (JP); Hitoshi Shimizu, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/556,933

(22) Filed: Dec. 1, 2014

(65) Prior Publication Data

US 2015/0131684 A1    May 14, 2015

Related U.S. Application Data

(63) Continuation of application No. PCT/JP2013/080136, filed on Nov. 7, 2013.

(30) Foreign Application Priority Data

Nov. 21, 2012  (JP) ................. 2012-255710

(51) Int. Cl.
*H01S 3/10* (2006.01)
*H01S 5/042* (2006.01)
*H01S 5/062* (2006.01)
*H01S 5/065* (2006.01)
(Continued)

(52) U.S. Cl.
CPC ............. *H01S 5/0427* (2013.01); *H01S 5/0651* (2013.01); *H01S 5/06226* (2013.01);
(Continued)

(58) Field of Classification Search
CPC  H01S 5/02212; H01S 5/06835; H01S 5/4025
USPC .......................................................... 372/26
See application file for complete search history.

(56) References Cited

U.S. PATENT DOCUMENTS

| | | |
|---|---|---|
| 7,092,425 B1 | 8/2006 | Schneider et al. |
| 2002/0181524 A1 | 12/2002 | Vusirikala |
| 2011/0135318 A1* | 6/2011 | Takeda et al. ................. 398/182 |

FOREIGN PATENT DOCUMENTS

| | | |
|---|---|---|
| JP | 2002-176225 A | 6/2002 |
| JP | 2011-205006 A | 10/2011 |

OTHER PUBLICATIONS

A. Valle ; M. Arizaleta ; K. Panajotov and M. Sciamanna, "Experimental study of transverse mode dynamics in vertical-cavity surface-emitting lasers under current modulation", Proc. SPIE 6997, Semiconductor Lasers and Laser Dynamics III, 69970Z (May 5, 2008); doi:10.1117/12.780405).*

(Continued)

*Primary Examiner* — Tod T Van Roy
*Assistant Examiner* — Vu A Vu
(74) *Attorney, Agent, or Firm* — Oblon, McClelland, Maier & Neustadt, L.L.P.

(57) ABSTRACT

A surface-emitting laser apparatus includes: a surface-emitting laser element; and a driving apparatus supplying a modulation-driving current to the surface-emitting laser element. The modulation-driving current is intensity-modulated to vary across a value of a bias current. The number of lateral modes of laser oscillation of the surface-emitting laser element changes from one to three at maximum in accordance with a value of the modulation-driving current. Among changing currents at which number of the lateral modes of the laser oscillation of the surface-emitting laser element changes, if a first changing current is defined at which the number of the lateral mode of the laser oscillation changes from one to two, the driving apparatus supplies the modulation-driving current to the surface-emitting laser element. The modulation-driving current is set so that a value of the first changing current is not between the bias current and a maximum value of the modulation-driving current.

11 Claims, 6 Drawing Sheets

(51) Int. Cl.
*H01S 5/42* (2006.01)
*H01S 5/183* (2006.01)

(52) U.S. Cl.
CPC .............. *H01S5/18344* (2013.01); *H01S 5/42* (2013.01); *H01S 5/0425* (2013.01); *H01S 5/18311* (2013.01); *H01S 5/18369* (2013.01); *H01S 5/18394* (2013.01); *H01S 5/423* (2013.01)

(56) References Cited

OTHER PUBLICATIONS

International Search Report Issued on Feb. 4, 2014 for PCT/JP2013/080136 Filed on Nov. 7, 2013 (English Language).

International Written Opinion Issued on Feb. 4, 2014 for PCT/JP2013/080136 Filed on Nov. 7, 2013.

Johan S. Gustaysson, et al., IEEE Journal of Quantum Electronics, vol. 38, No. 8, Aug. 2002, pp. 1089-1096.

Petter Westbergh, et al., IEEE Journal of Selected Topics in Quantum Electronics, vol. 15, No. 3, May/Jun. 2009, pp. 694-703.

A. Hsu, et al., IEE Proceedings Optoelectronics, vol. 151, No. 3, Jun. 2004, pp. 138-142.

Yu-Chia Chang, et al., Applied Physics A, vol. 95, 2009, pp. 1033-1037.

Angel Valle, et al., Journal of Optical Society of America B, vol. 23, No. 10, Oct. 2006, pp. 2148-2156.

\* cited by examiner

SURFACE-EMITTING LASER APPARATUS, OPTICAL MODULE, AND METHOD OF DRIVING SURFACE-EMITTING LASER ELEMENT

CROSS-REFERENCE TO RELATED APPLICATION

This application is a continuation of PCT International Application No. PCT/JP2013/080136 filed on Nov. 7, 2013 which claims the benefit of priority from Japanese Patent Application No. 2012-255710 filed on Nov. 21, 2012, the entire contents of which are incorporated herein by reference.

BACKGROUND OF THE INVENTION

1. Field of the Invention

The present invention relates to a surface-emitting laser apparatus, an optical module, and a method of driving a surface-emitting laser element.

2. Description of the Related Art

Surface-emitting laser elements (Vertical Cavity Surface Emitting Lasers: VCSELs) are used sometimes as signal light sources in a relatively short reach optical transmission such as optical interconnections. For example, Non-Patent Literature 1 discloses a multimode surface-emitting laser element oscillates laser in a plurality of lateral modes at a wavelength of 850 nm.

SUMMARY OF THE INVENTION

It is an object of the present invention to at least partially solve the problems in the conventional technology.

In accordance with one aspect of the present invention, a surface-emitting laser apparatus includes: a surface-emitting laser element; and a driving apparatus supplying a modulation-driving current to the surface-emitting laser element. The modulation-driving current is intensity-modulated to vary across a value of a bias current. The number of lateral modes of laser oscillation of the surface-emitting laser element changes from one to three at maximum in accordance with a value of the modulation-driving current. Among changing currents at which number of the lateral modes of the laser oscillation of the surface-emitting laser element changes, if a first changing current is defined at which the number of the lateral mode of the laser oscillation changes from one to two, the driving apparatus supplies the modulation-driving current to the surface-emitting laser element. The modulation-driving current is set so that a value of the first changing current is not between the bias current and a maximum value of the modulation-driving current.

In accordance with another aspect of the present invention, an optical module includes a surface-emitting laser apparatus. The surface-emitting laser apparatus includes: a surface-emitting laser element; and a driving apparatus supplying a modulation-driving current to the surface-emitting laser element. The modulation-driving current is intensity-modulated to vary across a value of a bias current. The number of lateral modes of laser oscillation of the surface-emitting laser element changes from one to three at maximum in accordance with a value of the modulation-driving current. Among changing currents at which number of the lateral modes of the laser oscillation of the surface-emitting laser element changes, if a first changing current is defined at which the number of the lateral mode of the laser oscillation changes from one to two, the driving apparatus supplies the modulation-driving current to the surface-emitting laser element. The modulation-driving current is set so that a value of the first changing current is not between the bias current and a maximum value of the modulation-driving current.

In accordance with still another aspect of the present invention, a method of driving a surface-emitting laser element in which the number of lateral modes of laser oscillation changes from one to three at maximum in accordance with a value of a modulation-driving current when the modulation-driving current is supplied. The modulation-driving current is intensity-modulated to vary across a value of a bias current. Among changing currents at which number of the lateral modes of the laser oscillation of the surface-emitting laser element changes, if a first changing current is defined at which the number of the lateral mode of the laser oscillation changes from one to two, the modulation-driving current is supplied to the surface-emitting laser element. The modulation-driving current is set so that a value of the first changing current is not between the bias current and the maximum value of the modulation-driving current.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
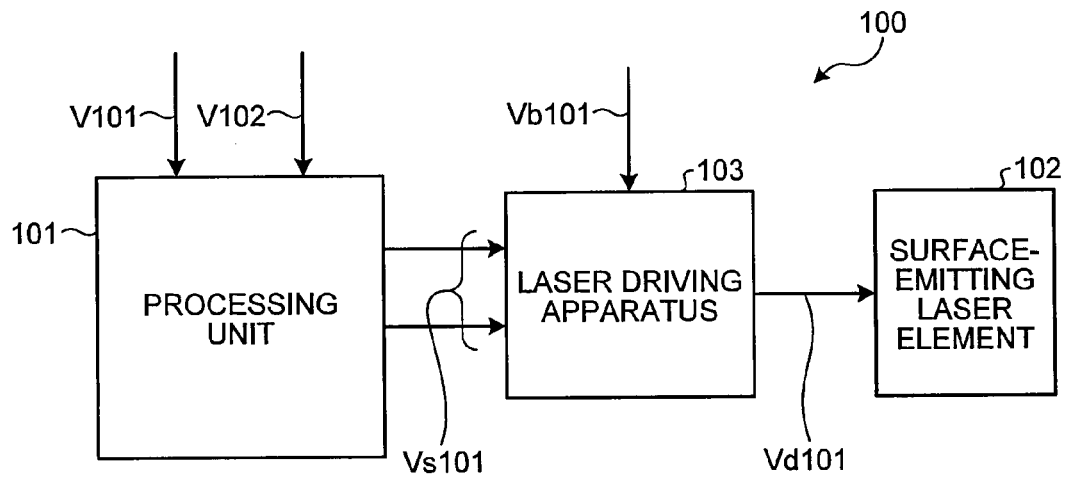
FIG. 1 is a block diagram illustrating a configuration of a surface-emitting laser apparatus according to an embodiment 1.

Hereinafter, embodiments a surface-emitting laser apparatus, an optical module and a method of driving a surface-emitting laser element according to the present invention will be described in detail with reference to the drawings. The present invention is not limited to the embodiments. Also, in each drawing, if deemed appropriate, identical or equivalent elements are given same reference numerals. In addition, it should be noted that the drawings are schematic depictions, and do not represent the actual relation of dimension of each element. Furthermore, different drawings may include portions using different scales and dimensional relations.

In a case of attempting to achieve a high speed optical transmission at a high modulation speed, it is preferable that a signal light is a laser light of which spectrum line width is narrow, that is, of which lateral modes are few in number.

However, in a case of driving, by a modulation current, a surface-emitting laser element outputting a laser light of which lateral modes are few in number, there was a problem that the modulated laser signal light worsened in quality, and thus excellent modulation characteristics could not be obtained.

In contrast, the present embodiments obtain an effect of capable of restraining a deterioration of the quality of a signal light and achieving excellent modulation characteristics.

FIG. 1 is a block diagram illustrating a configuration of a surface-emitting laser apparatus according to an embodiment 1 of the present invention. As illustrated in FIG. 1, the surface-emitting laser apparatus 100 includes a processing unit 101, a surface-emitting laser element 102, and a laser driving apparatus 103 provided between the processing unit 101 and the surface-emitting laser element 102.

The processing unit 101 conducts a calculation according to a command from outside, and outputs a differential voltage signal Vs101 which is a modulation signal according to a result of the calculation. Supply voltages V101 and V102 are supplied to the processing unit 101 from outside. The supply voltage V101 is, for example, 3.3 V of I/O voltage, and the supply voltage V102 is, for example, 1.5 V of core voltage. The laser driving apparatus 103 amplifies the differential voltage signal Vs101 outputted from the processing unit 101, superposes the amplified differential voltage signal Vs101 on a supplied bias voltage Vb101, and outputs it as a modulation-driving voltage Vd101. The modulation-driving voltage Vd101 is a voltage signal which is intensity-modulated to vary across a value of the bias voltage Vb101 and is constituted by a "0 (zero)" level of voltage lower than the bias voltage Vb101 and a "1" level of voltage higher than the bias voltage Vb101.

The modulation-driving voltage Vd101 outputted by the laser driving apparatus 103 is applied to the surface-emitting laser element 102. When the modulation-driving current is supplied, the surface-emitting laser element 102 outputs a predetermined wavelength of laser signal light. The laser light herein outputted by the surface-emitting laser element 102 has a wavelength corresponding to an energy bandgap of a semiconductor material of the active layer. Also, the bias voltage Vb101 corresponds to the energy bandgap of the semiconductor material of the active layer. For example, in a case where the wavelength of the laser light outputted by the surface-emitting laser element 102 is in 1.1 µm band, approximately 1.5 V of bias voltage Vb101 is supplied.

Figure 2:
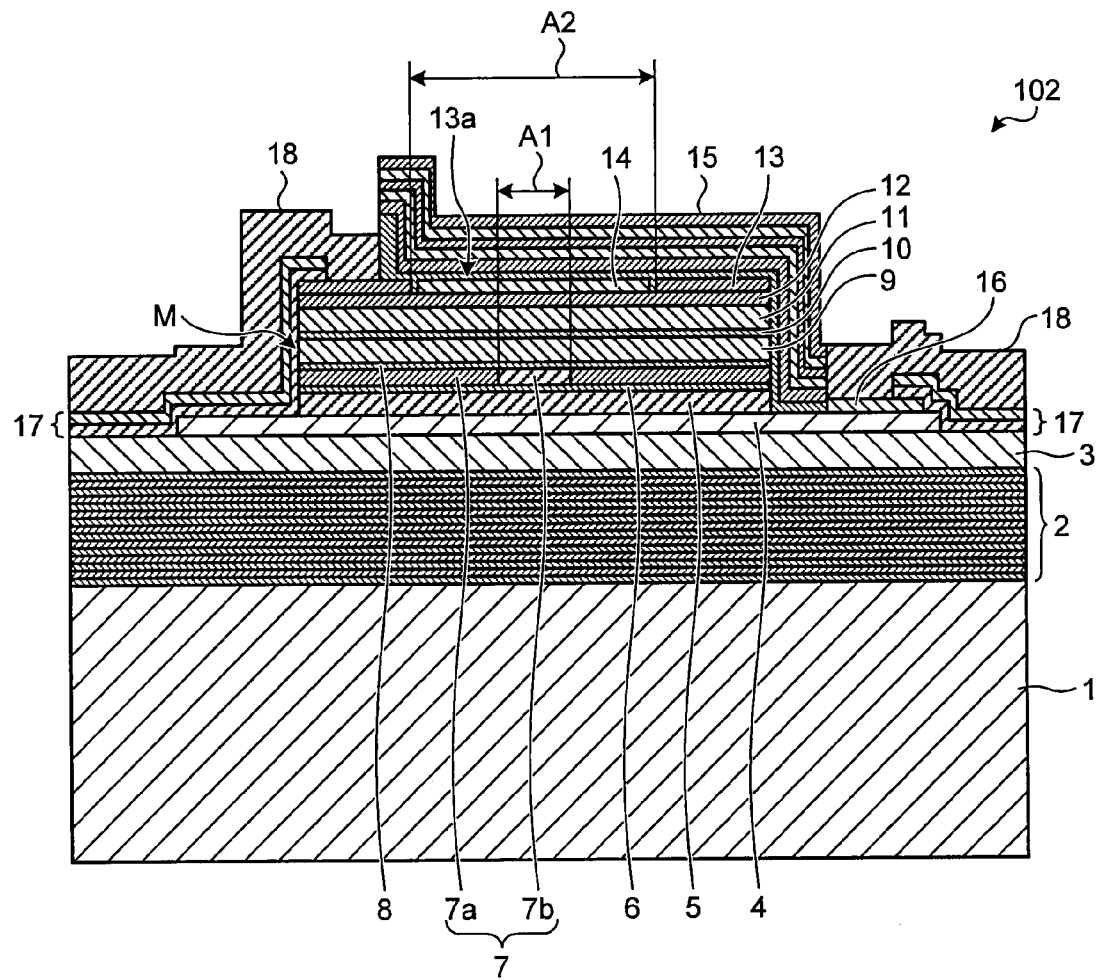
FIG. 2 is a schematic cross-sectional view of a surface-emitting laser element illustrated in FIG. 1.

An example of a specific configuration of the surface-emitting laser element 102 is explained next. FIG. 2 is a schematic cross-sectional view of the surface-emitting laser element 102 illustrated in FIG. 1.

As illustrated in FIG. 2, the surface-emitting laser element 102 has a structure in which a substrate 1, a lower distributed bragg reflector (DBR) mirror 2 which is a first reflecting mirror formed on the substrate 1, a buffer layer 3, an n-type contact layer 4, an active layer 5 having a multi quantum well structure, a lower compositional gradient layer 6, a current confinement layer 7 having a current confinement portion 7a positioned in an outer periphery and a current-injecting portion (or an aperture portion) 7b having a substantial round shape and being positioned at a center of the current confinement portion 7a, an upper compositional gradient layer 8, a p-type spacer layer 9, a $p^+$-type current path layer 10, a p-type spacer layer 11, and a $p^+$-type contact layer 12 are layered in this order. A columnar-shaped mesa post M is configured by the active layer 5 to the $p^+$-type contact layer 12.

The substrate 1 is made of, for example, undoped GaAs. The lower DBR mirror 2 is made of, for example, 34 pairs of GaAs/$Al_{0.9}Ga_{0.1}$As layers. The buffer layer 3 is made of, for example, undoped GaAs. The n-type contact layer 4 is made of, for example, n-type GaAs. The active layer 5 has a structure in which each of three InGaAs layers and each of four GaAs barrier layers are layered alternately for use of, for example, a 1.1 µm band of laser light, and the lowermost GaAs barrier layer serves as an n-type cladding layer.

Regarding the current confinement layer 7, the current confinement portion 7a is made of $Al_2O_3$ formed by a selective thermal oxidizing process, and the current-injecting portion 7b is made of AlAs. A diameter (aperture diameter) A1 of the current-injecting portion 7b is, for example, equal to or larger than 6 µm. The lower compositional gradient layer 6 and the upper compositional gradient layer 8 are made of, for example, AlGaAs, and are configured so that its Al composition increases stepwise as approaching the current confinement layer 7 in a thickness direction. The p-type spacer layers 9 and 11 are made of carbon-doped p-type GaAs, and the $p^+$-type current path layer 10 and the $p^+$-type contact layer 12 are made of carbon-doped $p^+$-type GaAs. A concentration of acceptor or donor of each of p-type layer or an n-type layer is, for example, approximately $1\times10^{18}$ $cm^{-3}$, and a concentration of acceptor of a $P^+$-type layer is, for example, equal to or larger than $1\times10^{19}$ $cm^{-3}$. A refractive index of each semiconductor layer made of GaAs is approximately 3.45.

Formed on the $p^+$-type contact layer 12 is a p-side ring-shaped electrode 13 being made of Pt/Ti and having an opening portion 13a at a center thereof. Outer diameters of the mesa post M and the p-side ring-shaped electrode 13 are, for example, equal to or larger than 30 µm, and an inner diameter (opening diameter) A2 of the opening portion 13a is, for example, equal to or larger than 11 µm.

Formed in the opening portion 13a of the p-side ring-shaped electrode 13 is a round disk-shaped phase-adjusting layer 14 made of, for example, dielectric silicon nitride (SiNx). The phase-adjusting layer 14 has a function of appropriately adjusting positions of a node and an antinode of an optical standing wave formed between the lower DBR mirror 2 and the upper DBR mirror 15 constituting an optical cavity.

Furthermore, formed from above the phase-adjusting layer 14 to the outer periphery of the mesa post M is an upper DBR mirror 15 as a dielectric second reflecting mirror. The upper DBR mirror 15 is made of, for example, 10 to 12 pairs of SiNx/$SiO_2$. The upper DBR mirror 15 may be the pairs of, for example, α-Si/$SiO_2$ or the pairs of the α-Si/$Al_2O_3$ in numbers so that an approximately 99% of appropriate reflectivity can be obtained in accordance with a refractive index of its material.

The n-type contact layer 4 extends from below the mesa post M to an outer periphery side of the upper DBR mirror 15. A half-ring-shaped n-side electrode 16 made of, for example, AuGeNi/Au is formed on a surface of the n-type contact layer 4. For example, the n-side electrode 16 is 80 µm in outer diameter and 40 µm in inner diameter. Formed for surface protection of an area in which the upper DBR mirror 15 is not formed is a passivation film 17 made of a dielectric such as SiNx or the like.

An extraction electrode 18 made of Au is formed to contact the n-side electrode 16 via an opening portion formed through the passivation film 17. On the other hand, an extraction electrode 18 made of Au is formed to contact the p-side ring-shaped electrode 13 via an opening portion formed through the passivation film 17. The extraction electrodes 18 are connected to the laser driving apparatus 103.

The modulation-driving voltage Vd101 is applied from the extraction electrodes 18 via the n-side electrode 16 and the p-side ring-shaped electrode 13 to the surface-emitting laser element 102. The injected modulation-driving current mainly flows in the low resistance $p^+$-type contact layer 12 and the $p^+$-type current path layer 10, and a current path is constricted within the current-injecting portion 7b by current confinement layer 7; thus, the modulation-driving current Vd101 is supplied to the active layer 5 with a high current density. As a result, carriers are injected into the active layer 5, and a spontaneous emission light is emitted from the active layer 5. Among lights emitted spontaneously, a light of 1100 nm band which is a laser oscillation wavelength forms a standing wave between the lower DBR mirror 2 and the upper DBR mirror 15, and is amplified by the active layer 5. When the injected current is equal to or larger than a threshold, the light forming the standing wave makes a laser oscillation, and a laser signal light of the 1100 nm band is outputted from the opening portion 13a of the p-side ring-shaped electrode 13.

The number of the lateral modes of laser oscillation varies in accordance with a value of current injected into the surface-emitting laser element 102. To be more specific, when a value of an injected current exceeds a threshold current, a fundamental mode makes a laser oscillation at first. In this state, the number of the lateral modes of the laser oscillation is one. Furthermore, increasing a driving current causes the number of the lateral modes of laser oscillation to increase stepwise, e.g., 2, 3, . . . . The present specification assumes a state where laser oscillation is made in a few (approximately 1 to 3) lateral modes and defines a-few-lateral modes oscillation state as a state where the number of the lateral modes of laser oscillation vary from one to three at maximum corresponding to a value of the modulation-driving current when the modulation-driving current is supplied.

Figure 3:
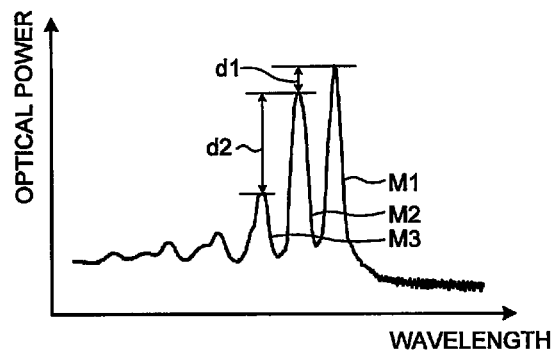
FIG. 3 is a drawing illustrating an example of a spectrum of a laser light of which lateral modes are few in number.

FIG. 3 is a drawing illustrating an example of a spectrum of a laser light of a few lateral modes. A vertical axis indicates optical power in dB. In the spectrum of FIG. 3, a laser light M1 of a fundamental mode, a laser light M2 of a first higher-order mode, and a laser light M3 as a second higher-order mode are shown as lateral modes. In the spectrum, an power ratio d1 between the fundamental mode laser light M1 and the first higher-order mode laser light M2 is smaller than 30 dB, and an power ratio d2 between the first higher-order mode laser light M2 and the second higher-order mode laser light M3 is equal to or larger than 30 dB. In this case, the lateral modes of laser oscillation are two in number.

More generally, in a case where a plurality of lateral modes are shown on a spectrum and where a power ratio between an $N^{th}$ (N=1 to 3) mode of laser light and an $(N+1)^{th}$ mode of laser light is equal to or larger than 30 dB, it is defined that N is the number of the lateral modes of laser oscillation.

However, in a case where an N does not exist which achieves an power ratio of equal to or larger than 30 dB between an $N^{th}$ mode laser light and an $(N+1)^{th}$ mode laser light, N i.e. the number of lateral mode is defined as the largest one of the numbers of the modes of which power ratios are within 30 dB relative to the mode of the greatest power. For example, N does not exist which achieves an power ratio of equal to or larger than 30 dB between an $N^{th}$ mode laser light and an $(N+1)^{th}$ mode laser light in a state where an power ratio is 5 dB between a first mode laser light and a second mode laser light, an power ratio is 20 dB between the second mode laser light and a third mode laser light, and an power ratio is 20 dB between the third mode laser light and a fourth mode laser light. If the mode of the greatest power is N=1, the greatest number of the modes among those within 30 dB of power ratios relative to the mode of the greatest power is three; thus, the number of the lateral modes is three.

It was a problem that, in a case where a surface-emitting laser element, of which lateral modes of laser oscillation were fewer in number such as the above-described a-few-lateral modes, is driven by a modulation-driving current, the quality of the outputted laser signal light deteriorates sometimes.

According to a close investigation conducted by the inventors of the present invention, in a case where a driving current varies within a modulation amplitude by an intensity modulation, the number of lateral modes of laser oscillation of a surface-emitting laser element changes sometimes by the variation of the driving current. The inventors of the present invention found that a variation or the like of spatial distribution of a carrier concentration may occur in the surface-emitting laser element due to this change, and as a result, a noise is superposed on a laser signal light; and thus, deterioration of quality thereof may occur sometimes. The inventors of the present invention found furthermore that, in a case where a value of current at which the number of lateral modes changes is within a modulation amplitude of a modulation-driving current and smaller than a value of a bias current, it is possible to restrain the quality of the laser signal light from being deteriorated to a great extent.

In the surface-emitting laser apparatus 100 according to the present embodiment 1, the quality of the laser signal light is restrained from being deteriorated to a great extent by setting a modulation-driving current (or the modulation-driving voltage Vd101) so that the bias current is greater than a value of current (hereafter called switching current) at which the number of the lateral modes of laser oscillation of the surface-emitting laser element 102 changes.

Figure 4:
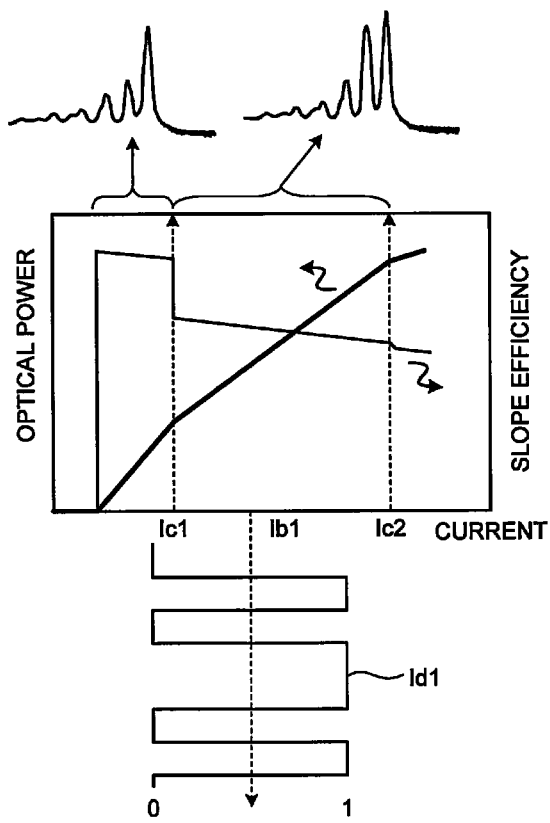
FIG. 4 is a drawing illustrating an example of setting a bias current in the embodiment 1.

FIG. 4 is a drawing illustrating an example of setting a bias current in the present embodiment 1. Current-output optical power characteristics and a slope efficiency of the surface-emitting laser element 102 are shown in the middle of FIG. 4. In the case of FIG. 4, the number of the lateral modes of laser oscillation changes from one to two at a changing current Ic1 as a first changing current, and the number of the lateral modes changes from two to three at a changing current Ic2 as a second changing current which is adjacent to the changing current Ic1 on its higher current side. In an upper portion of the drawing, spectra are shown for cases where the number of the lateral modes are one and two respectively. In addition, kinks occur in the current-output optical power characteristics at the changing currents Ic1 and Ic2, and the slope efficiency varies.

In the example shown in FIG. 4, the modulation-driving current Id1 is set so that the bias current Ib1 is greater than the changing current Ic1. To be more specific, the changing current Ic1 is of a value between the bias current Ib1 of the modulation-driving current Id1 and a current of "0" level that is the minimum value of the modulation-driving current Id1. In addition, a current of "1" level that is the maximum value of the modulation-driving current Id1 is smaller than the changing current Ic2 at which the number of the lateral modes change from two to three, and the changing current Ic2 does not exist between the bias current Ib1 and the current of "1" level. It is possible to restrain the quality of the laser signal light from being deteriorated to a great extent by setting the driving current in this manner.

Figure 5:
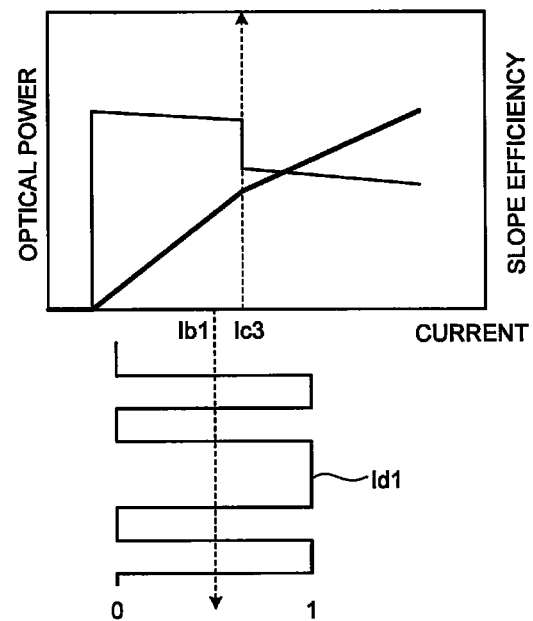
FIG. 5 is a drawing illustrating an example of setting a bias current in a comparison embodiment.

Meanwhile, FIG. 5 is a drawing illustrating an example of setting a bias current in a comparison embodiment. In the middle of FIG. 5, current-output optical power characteristics and a slope efficiency of a comparison surface-emitting laser element which is different from the surface-emitting laser element 102 are shown schematically. In the comparison surface-emitting laser element, the number of the lateral modes of laser oscillation is supposed to change from one to two at a changing current Ic3 as a first changing current.

In the example shown in FIG. 5, the modulation-driving current Id1 is set so that the bias current Ib1 is smaller than the changing current Ic3. To be more specific, the changing current Ic3 is of a value between the bias current Ib1 and a current of "1" level. If the modulation-driving current Id1 is set so that the changing current Ic3, at which the number of the lateral modes changes from one to two, is of a value between the bias current Ib1 and a current of "1" level, the quality of a laser signal light worsens more than that in the case of FIG. 4.

Regarding an influence given by the change of the number of the lateral modes to the quality of a laser signal light, a case in which the number of the lateral modes changes from one to two is the most influential, and cases in which a higher-order mode increases further such as from two to three, from three to four, are less influential.

Accordingly, as a modification 1 of FIG. 4, a case is considered in which the modulation-driving current Id1 is set so that the changing current Ic1 at which the number of the lateral modes changes from one to two is between the bias current Ib1 and a current of "0" level, and the changing current at which the number of the lateral modes changes from two to three is between the bias current Ib1 and a current of "1" level. The comparison embodiment is considered in which a changing current Ic3 at which the number of the lateral modes changes from one to two is between the bias current Ib1 and a current of "1" level. A comparison of the modification 1 and the comparison embodiment indicates that a laser signal light of the modification 1 is subjected to a fewer deterioration of quality.

That is, if the bias current Ib1 is set to be greater than the changing current (first switching current) in the vicinity of the bias current Ib1, an effect of restraining the quality of the laser signal light from being deteriorated is obtained even if the second changing current at which higher-order modes increase is between the bias current Ib1 and the current of "1" level.

If, as a modification 2 of FIG. 4, the modulation-driving current Id1 in the modification 1 is set so that the current of "0" level that is the minimum value of the modulation-driving current Id1 is greater than the changing current Ic1 at which the number of the lateral modes changes from one to two, the modification 2 is more preferable than the modification 1. Furthermore, if, as a modification 3 of FIG. 4, the modulation-driving current Id1 is set so that the current of "0" level is greater than the changing current Ic1 at which the number of the lateral modes changes from one to two, and the current of "1" level is smaller than the changing current Ic2 at which the number of the lateral modes changes from two to three, the changing current is not included within a modulation amplitude of the modulation-driving current. That is, since the number of the lateral modes of laser oscillation does not change while driving the surface-emitting laser element, a deterioration of quality of the laser signal light is further restrained, and thus the modification 3 is more preferable than the modifications 1 and 2.

Next, surface-emitting laser apparatus configured as shown in FIG. 1 are produced as an example of the present invention and a comparison example, and a modulation-driving voltage was applied to drive each of the surface-emitting laser elements at a modulation rate of 10 Gbps, and eye diagrams of outputted laser signal lights were measured.

Figure 6:
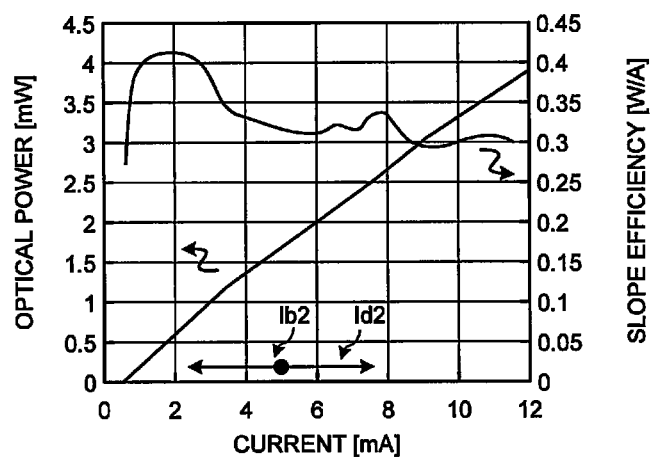
FIG. 6 is a drawing illustrating a setting of a bias current of an example.

Herein in the example, the surface-emitting laser element having the current-output optical power characteristics and the slope efficiency characteristics shown in FIG. 6 was used. In this surface-emitting laser element, the changing current at which the number of the lateral modes of laser oscillation changes from one to two was approximately 3 mA, and the changing current at which the number of the lateral modes of laser oscillation changes from two to three was approximately 9 mA. Based on this, the bias current Ib2 of the modulation-driving current Id2 was set at 5 mA, and the range of the modulation-driving current Id2 was set from 2.5 mA to 7.5 mA (±2.5 mA). That is, in this example, the driving current Id2 is set so that the bias current Ib2 for the modulation-driving current Id2 is set at 5 mA which is greater than the first changing current (approximately 3 mA) having a value close to that of the bias current Ib2, and so that the second changing current at higher current side of the first changing current does not exist between the bias current Ib2 and the current of "1" level.

Since a threshold current of the surface-emitting laser element of the example is approximately 0.3 mA, 5 mA of bias current Ib2 is approximately seventeen times the threshold current. Increasing the bias current Ib2 in such a way causes a relaxation oscillation frequency to increase, thereby facilitating a high rate modulation. It is preferable that the bias current Ib2 is equal to or larger than five times the threshold current of the surface-emitting laser element.

Figure 7:
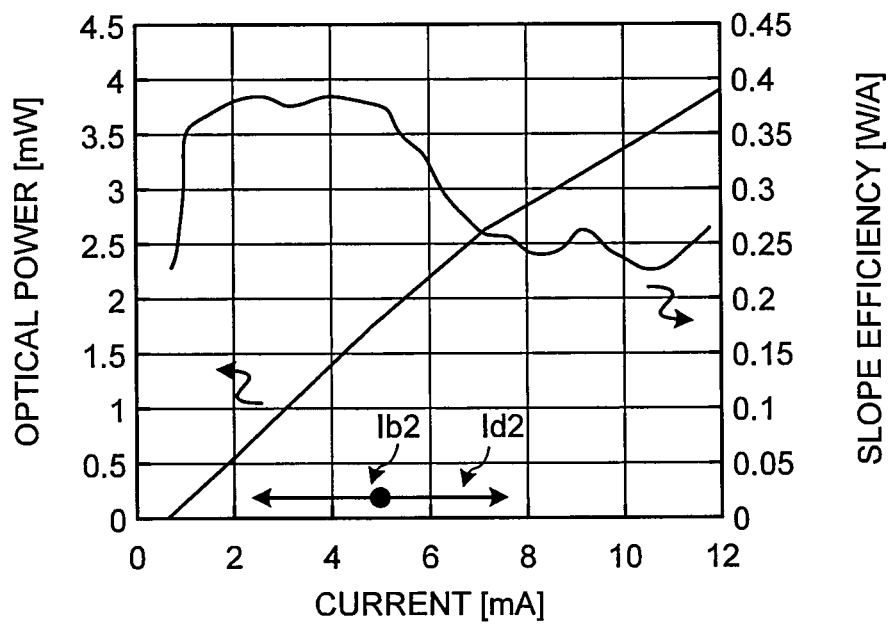
FIG. 7 is a drawing illustrating a setting of a bias current of a comparison example.

Meanwhile, as the comparison example, the surface-emitting laser element having the current-output optical power characteristics and the slope efficiency characteristics shown in FIG. 7 was used. The changing current of the surface-emitting laser element at which the number of the lateral modes for laser oscillation changes from one to two was approximately 6 mA. In the comparison example, similarly to the example, the bias current Ib2 of the modulation-driving current Id2 was set at 5 mA, and the range of the modulation-driving current Id2 was set from 2.5 mA to 7.5 mA (±2.5 mA). That is, in the comparison example, the first changing current (approximately 6 mA) is of a value between 5 mA of the bias current Ib2 and 7.5 mA of the current of "1" level.

Figure 8:
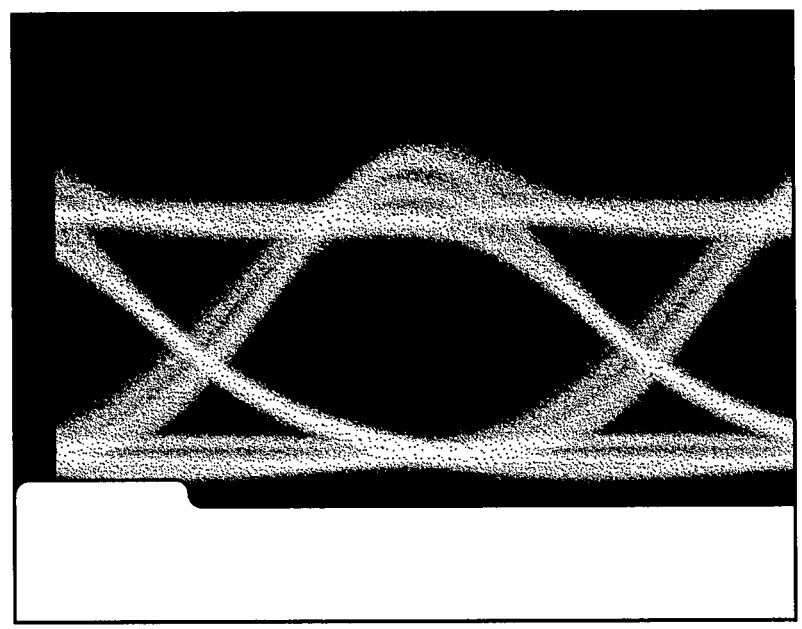
FIG. 8 is a drawing illustrating an eye diagram of the example.
Figure 9:
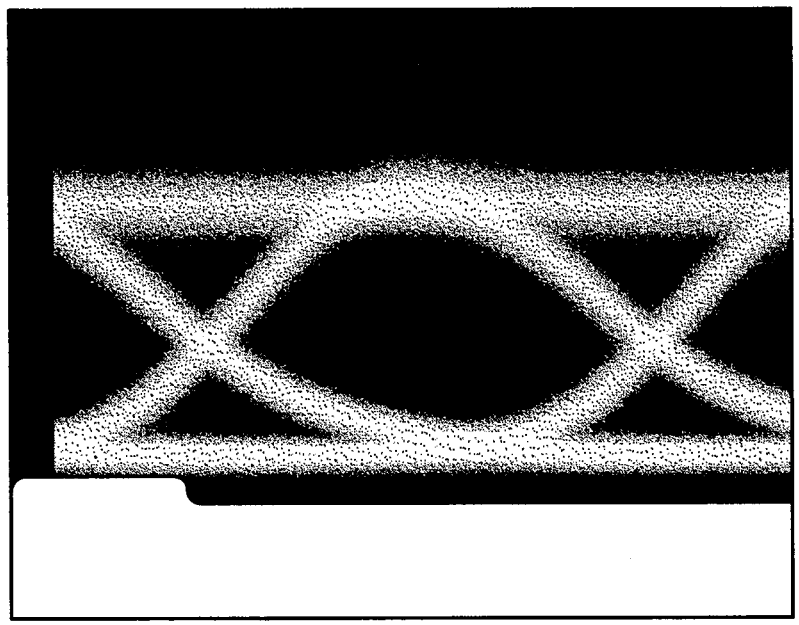
FIG. 9 is a drawing illustrating an eye diagram of the comparison example.

FIG. 8 is a drawing illustrating an eye diagram of the example. FIG. 9 is a drawing illustrating an eye diagram of the comparison example. As illustrated in FIGS. 8 and 9, a trace of the eye diagram of the comparison example was thick. This phenomenon indicates that, in the comparison example, the laser signal light has noise that is large in degree and an error rate of transmission data is high. On the other hand, the eye diagram of the example indicated that a trace maintained to be thin. This phenomenon indicates that, in the example, the laser signal light has noise that is small in degree and an error rate of transmission data is low.

The noise of the laser signal light emerges as a jitter in a direction of time axis. Since the higher the modulation rate is, the shorter a time period per one bit is, an influence of the jitter increases relatively. Therefore, in a case where the modulation rate is high in the surface-emitting laser apparatus of the example, e.g. if the modulation rate is equal to or larger than 25 Gbps, an effect is distinguishable that it is possible to restrain a deterioration of the quality of the signal light to achieve excellent modulation characteristics.

Although the modulation-driving current was set in the same way in the above-described embodiment 1 and the comparison embodiment, the surface-emitting laser apparatus exerting the effect as the embodiment 1 of the present invention is configured by using a surface-emitting laser element having a changing current value which is in a predetermined relationship with the modulation-driving current. Such embodiment 1 is effective in a case where the effect as the embodiment 1 of the present invention is desired to obtain at a desirable modulation-driving current.

A value of the changing current at which the number of the lateral modes of laser oscillation changes can be adjusted by changing, for example, the aperture diameter A1 of an aperture portion of the current confinement layer 7 of the surface-emitting laser element 102 or the opening diameter A2 of the opening portion 13a of the p-side ring-shaped electrode 13 in FIG. 2.

As a preferable example, it is preferable that the aperture diameter A1 of the current confinement layer 7 is equal to or larger than 6 μm, the number of lateral modes of oscillation is two, the opening diameter A2 of the p-side ring-shaped electrode 13 is equal to or larger than 11 μm, and electric field intensity distributions of the fundamental mode and the first higher-order mode as oscillation modes do not overlap the p-side ring-shaped electrode 13 so much for preventing a loss from occurring so much. Since an oscillation threshold current of the first higher-order mode decreases by restraining the loss in this manner, it is possible to set the bias current low.

As another preferable example, it is preferable that the aperture diameter A1 of the current confinement layer 7 is equal to or larger than 8 μm, the number of lateral modes of oscillation is two or three, the opening diameter A2 of the p-side ring-shaped electrode 13 is equal to or larger than 12 μm, and electric field intensity distributions of the fundamental mode and the first higher-order mode of oscillation (and in addition the second higher-order mode in a case where the number of lateral modes is three) do not overlap the p-side ring-shaped electrode 13 so much for preventing a loss from occurring so much. Since an oscillation threshold current of a intended higher-order mode decreases by restraining the loss in this manner, it is possible to set the bias current low similarly to the description above.

The surface-emitting laser apparatus according to the embodiment 1 of the present invention can configure various parallel optical modules in combination with a surface-emitting laser array, a light-receiving element array, and an optical waveguide such as an optical fiber cable.

Figure 10:
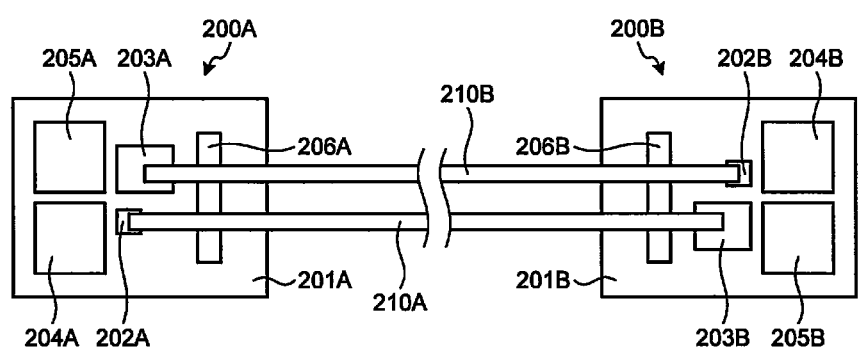
FIG. 10 is a schematic plan view illustrating a transmitting-and-receiving system in which two optical transmitter-receiver modules according to the embodiment 2 are connected via two optical fibers.

FIG. 10 is a schematic plan view illustrating a transmitting-and-receiving system in which two optical transmitter-receiver modules 200A and 200B according to the present embodiment 2 are connected via optical waveguides 210A and 210B that are two optical fiber cables. In FIG. 10, the optical transmitter-receiver module 200A is configured by a retainer 201A, a spacer 206A, a surface-emitting laser array 202A of the present invention, a light-receiving element array 203A, a driving circuit 204A, and an amplification circuit 205A. Each element is provided on the retainer 201A, that is, the optical waveguides 210A and 210B such as optical fiber cables are carried on, and positioned by, the spacer 206A. The surface-emitting laser array 202A transmits optical signals via the optical waveguide 210A. The light-receiving element array 203A receives the optical signals transmitted via the optical waveguide 210B and converts the received optical signals to electric signals. The driving circuit 204A controls a state of light-emission of the surface-emitting laser array 202A. The amplification circuit 205A amplifies the electric signals converted by the light-receiving element array 203A. Light emission of the surface-emitting laser array 202A is controlled with a control signal supplied from an external control unit (not illustrated in the drawings) via the driving circuit 204A. The electric signals converted by the light-receiving element array 203A are transmitted to the control unit via the amplification circuit 205A. For avoiding complexity in the drawing, wire bondings between the driving circuit 204A and the surface-emitting laser array 202A, and between the amplification circuit 205A and the light-receiving element array 203A are omitted to be drawn.

The optical transmitter-receiver module 200B has a configuration similar to that of the optical transmitter-receiver module 200A and is connected to form a pair so that an optical signal from a surface-emitting laser of an optical transmitter-receiver module at one side is received by a light-receiving element of an optical transmitter-receiver module at the other side via an optical waveguide. That is, the optical transmitter-receiver module 200B is configured by a retainer 201B, a spacer 206B, the surface-emitting laser array 202B of the present invention, a light-receiving element array 203B, a driving circuit 204B, and an amplification circuit 205B. Each element is provided on the retainer 201B, that is, the optical waveguides 210A and 210B are carried on, and positioned by, the spacer 206B. The surface-emitting laser array 202B transmits optical signals via the optical waveguide 210B. The light-receiving element array 203B receives the optical signals transmitted via the optical waveguide 210A and converts the received optical signals to electric signals. The driving circuit 204B controls a state of light-emission of the surface-emitting laser array 202B. The amplification circuit 205B amplifies the electric signals converted by the light-receiving element array 203B. Light emission of the surface-emitting laser array 202B is controlled with a control signal supplied from an external control unit (not illustrated in the drawings) via the driving circuit 204B. The electric signals converted by the light-receiving element array 203B are transmitted to the control unit via the amplification circuit 205B.

Next, an optically coupled portion between the surface-emitting laser array 202A and the optical waveguide 210A in the optical transmitter-receiver module 200A illustrated in FIG. 10 and an optically coupled portion between the surface-emitting laser array 202B and the optical waveguide 210B in the optical transmitter-receiver module 200B illustrated in FIG. 10 are explained specifically. Although the optically coupled portion between the surface-emitting laser array 202A and the optical waveguide 210A of the optical transmitter-receiver module 200A will be explained in the following, this optically coupled portion between them can be applied to the optically coupled portion between the surface-emitting laser array 202B and the optical waveguide 210B of the optical transmitter-receiver module 200B.

Figure 11:
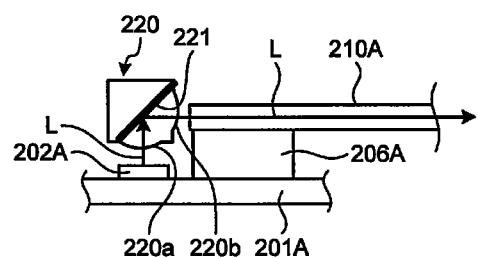
FIG. 11 is a side view illustrating an example of an optically coupled portion of a surface-emitting laser and an optical waveguide.

FIG. 11 is a side view illustrating an example of the optically coupled portion between the surface-emitting laser array 202A and the optical waveguide 210A. Provided in the example illustrated in FIG. 11 as the optical coupling means is a mirror assembly 220, being provided above the surface-emitting laser array 202A and lateral to the end surface of the optical waveguide 210A, having an incident surface 220a facing the surface-emitting laser array 202A and an emitting surface 220b facing an end surface of the optical waveguide 210A. A reflecting surface 221 is provided in the mirror assembly 220. An optical signal L emitted from the surface-emitting laser array 202A is incident into the incident surface 220a of the mirror assembly 220, reflected by the reflecting surface 221, emitted from the emitting surface 220b, coupled at the end surface of the optical waveguide 210A, and thereby propagating in the optical waveguide 210A. A microlens (array) for collimation or focusing may be provided on the incident surface 220a and/or the emitting surface 220b of the mirror assembly 220.

Jitter characteristics of an optical module having the surface-emitting laser apparatus of the example provided thereon and an optical module having the surface-emitting laser apparatus of the comparison example provided thereon were evaluated by making the optical transmitter-receiver modules face each other in each of the optical module as described above and using 12.5 Gbps of modulation rate and $2^{31}-1$ of signal data PRBS. As a result of that, a jitter with background component of the measuring system removed was large in degree, i.e., equal to or larger than 0.35 UI (unit interval: time length per 1 bit) in the optical module having the surface-emitting laser device of the comparison example provided thereon. On the other hand, 0.2 UI of sufficiently low value of jitter was obtained in the optical module having the surface-emitting laser device of the example provided thereon. As a criterion of excellent transmission characteristics, it is preferable that a jitter is equal to or lower than 0.3 UI. As described above, the optical module provided with the surface-emitting laser device of the example can restrain a deterioration of quality of a signal light and is an optical module achieving excellent modulation characteristics.

However, the present invention is not limited to this, and a surface-emitting laser apparatus exerting the effect of the embodiment of the present invention may be realized by driving a surface-emitting laser element, which is desired to use, with a modulation-driving current which is in a predetermined relationship with its changing current value. Although typically a bias current is 5 mA and an amplitude is 3 mA as an example of the modulation-driving current, the bias current may be 3 mA to 7 mA and the amplitude may be 2 mA to 3 mA. In this case, the maximum value of the modulation-driving current is equal to or lower than 10 mA.

A surface-emitting laser element which can be used for the present invention is not limited to the configuration illustrated in FIG. 2. For example, the present invention can be applied to a surface-emitting laser element which is not of an intracavity structure. That is, the present invention can be applied to a surface-emitting laser element which is of a structure in which carrier injected into an active layer is injected into the active layer via a lower DBR mirror and an upper DBR mirror respectively or via one of the lower DBR mirror and the upper DBR mirror.

Although the n-type semiconductor layer is disposed below the active layer and the p-type semiconductor layer is disposed above the active layer in the above-described embodiment, the n-type semiconductor layer may be disposed above the active layer and the p-type semiconductor layer may be disposed below the active layer.

In the above-described embodiment, a material of a compound semiconductor, size and the like are set for use of 1.1 μm wavelength band. However, each material, size and the like are set appropriately in accordance with an oscillation wavelength of a desirable laser light and are not limited specifically. For example, an InP-based material may be used for a semiconductor material constituting each semiconductor layer. In this case, an Al-containing layer can be constituted by an InAlAs layer.

The present invention is not limited by the above-described embodiment. The present invention includes a configuration of combining each of the above-described elements appropriately. Further effects or modifications can be derived by those skilled in the art easily. Therefore, further wide aspects of the present invention are not limited to the above-described embodiment, and various modifications are possible.

As described above, a surface-emitting laser apparatus, an optical module, and a method of driving a surface-emitting laser element according to the present invention is suitable for use in a field of optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface-emitting laser apparatus comprising:
   a surface-emitting laser element; and
   circuitry configured to supply a modulation-driving current to the surface-emitting laser element, the modulation-driving current being intensity-modulated to vary across a value of a bias current, wherein
   a number of lateral modes of laser oscillation of the surface-emitting laser element changes from one to three at maximum in accordance with a value of the modulation-driving current, and
   among one or more changing currents at which the number of the lateral modes of the laser oscillation of the surface-emitting laser element changes, said one or more changing currents comprising a first changing current at which the number of the lateral modes of the laser oscillation changes from one to two, the circuitry is configured to restrain the modulation-driving current so that a value of the first changing current is not between the bias current and a maximum value of the modulation-driving current and to supply the modulation-driving current, of which a minimum value is greater than the first changing current, to the surface-emitting laser element.

2. The surface-emitting laser apparatus according to claim 1, wherein the circuitry is configured to supply the modulation-driving current, of which the bias current is of a value greater than the first changing current, to the surface-emitting laser element.

3. The surface-emitting laser apparatus according to claim 1, wherein the circuitry is configured to supply the modulation-driving current, the maximum value of which is smaller than a second changing current which is adjacent to a higher current side of the first changing current of the changing currents, to the surface-emitting laser element.

4. The surface-emitting laser apparatus according to claim 1, wherein
   the surface-emitting laser element comprises:
      a first reflecting mirror and a second reflecting mirror;
      an active layer disposed between the first reflecting mirror and the second reflecting mirror; and
      a current confinement layer being disposed between the second reflecting mirror and the active layer and having a current-injecting portion and a selective oxide layer formed at an outer periphery of the current-injecting portion by a selective thermal oxidizing process, wherein
   an aperture diameter of the current-injecting portion is adjusted so that the first changing current is of the value.

5. The surface-emitting laser apparatus according to claim 4, wherein the aperture diameter of the current-injecting portion is equal to or larger than 8 μm.

6. The surface-emitting laser apparatus according to claim 1, wherein, when the number of the lateral modes of laser oscillation is maximum within a range of the modulation-driving current, the number of the lateral modes is two, and the lateral modes are a fundamental mode and a first higher-order mode.

7. The surface-emitting laser apparatus according to claim 1, wherein, when the number of the lateral modes of laser oscillation is maximum within a range of the modulation-driving current, the number of the lateral modes is three and the lateral modes are a fundamental mode, a first higher-order mode, and a second higher-order mode.

8. The surface-emitting laser apparatus according to claim 1, wherein the maximum value of the modulation-driving current is equal to or smaller than 10 mA.

9. The surface-emitting laser apparatus according to claim 1, wherein a modulation rate is equal to or larger than 25 Gbps.

10. An optical module comprising a surface-emitting laser apparatus, the surface-emitting laser apparatus comprising:
   a surface-emitting laser element; and
   circuitry configured to supply a modulation-driving current to the surface-emitting laser element, the modulation-driving current being intensity-modulated to vary across a value of a bias current, wherein
   a number of lateral modes of laser oscillation of the surface-emitting laser element changes from one to three at maximum in accordance with a value of the modulation-driving current, and
   among one or more changing currents at which the number of the lateral modes of the laser oscillation of the surface-emitting laser element changes, said one or more changing currents comprising a first changing current at which the number of the lateral modes of the laser oscillation changes from one to two, the circuitry is configured to restrain the modulation-driving current so that a value of the first changing current is not between the bias current and a maximum value of the modulation-driving current and to supply the modulation-driving current, of which a minimum value is greater than the first changing current, to the surface-emitting laser element.

11. A method of driving a surface-emitting laser element in which a number of lateral modes of laser oscillation changes from one to three at maximum in accordance with a value of a modulation-driving current when the modulation-driving current is supplied, the modulation-driving current being intensity-modulated to vary across a value of a bias current, wherein said method comprises:
   among one or more changing currents at which the number of the lateral modes of the laser oscillation of the surface-emitting laser element changes, said one or more changing currents comprising a first changing current at which the number of the lateral modes of the laser oscillation changes from one to two, restraining the modulation-driving current by circuitry so that a value of the first changing current is not between the bias current and the maximum value of the modulation-driving current; and
   supplying the modulation-driving current, of which a minimum value is greater than the first changing current, by the circuitry to the surface-emitting laser element.

* * * * *